United States Patent [19]

Sawada

[11] Patent Number: 5,550,494
[45] Date of Patent: Aug. 27, 1996

[54] VOLTAGE SELECTING DEVICE FOR RECEIVING A PLURALITY OF INPUTS AND SELECTIVELY OUTPUTTING ONE THEREOF

[75] Inventor: Kikuzo Sawada, Tokyo, Japan

[73] Assignee: Nippon Steel Corporation, Tokyo, Japan

[21] Appl. No.: 377,052

[22] Filed: Jan. 23, 1995

[30] Foreign Application Priority Data

Jan. 25, 1994 [JP] Japan ................................. 6-023106

[51] Int. Cl.⁶ ............................. H03K 5/24; H03K 17/62
[52] U.S. Cl. ...................... 327/69; 327/408; 365/185.23
[58] Field of Search ................................ 327/539, 538, 327/537, 63, 69, 427, 434, 436, 437, 546, 313, 407, 408, 99, 333; 365/185.23, 185.03

[56] References Cited

U.S. PATENT DOCUMENTS

| | | | |
|---|---|---|---|
| 4,556,804 | 12/1985 | Dewitt | 327/541 |
| 4,975,883 | 12/1990 | Baker et al. | 365/185.23 |
| 5,021,680 | 6/1991 | Zaw Win et al. | 327/408 |
| 5,099,143 | 3/1992 | Arakawa | 365/185.23 |
| 5,157,280 | 10/1992 | Schreck et al. | 365/185.23 |
| 5,278,460 | 1/1994 | Casper | 327/546 |
| 5,386,422 | 1/1995 | Endoh et al. | 365/185.23 |

FOREIGN PATENT DOCUMENTS 5-101686   4/1993   Japan.

*Primary Examiner*—Timothy P. Callahan
*Assistant Examiner*—Terry L. Englund
*Attorney, Agent, or Firm*—Pollock, Vande Sande & Priddy

[57] ABSTRACT

A power supply circuit selectively provides various voltage signals to memory devices, such as EPROM or EEPROM for example. The power supply circuit receives voltage signals at input terminals and selectively outputs a voltage signal, in accordance with the requirement for reading, writing and erasing operations, while preventing leakage current between voltage signals. Among other things, the power supply circuit provides a relatively low impedance and does not require high voltage levels for performing the above memory operations. The selection of voltage signals at an output terminal is effected by control means for controlling conductivity and non-conductivity of MOS transistors based on a control signal supplied from a control signal input terminal.

3 Claims, 4 Drawing Sheets he present invention relates to a voltage selecting device
VOLTAGE SELECTING DEVICE FOR RECEIVING A PLURALITY OF INPUTS AND SELECTIVELY OUTPUTTING ONE THEREOF

FIELD OF THE INVENTION

The present invention relates to a voltage selecting device for receiving a plurality of inputs and selectively outputting one thereof, and more particularly to a voltage selecting device used in a non-volatile semiconductor memory such as EPROM in which erasure by ultraviolet rays is possible or EEPROM in which electrical batch erasure is possible.

BACKGROUND OF THE INVENTION

Most non-volatile memory LSI's such as EPROM's or flash EEPROM's require two kinds of power supply voltages. A first power supply voltage VDD is a power supply voltage which is necessary at the time of reading, at the time of programming or at the time of other operating modes. For example, in a general EPROM, VDD is 5 V.

A second power supply voltage VPP is a power supply voltage which is necessary for programming or erasing a non-volatile memory. For example, in a general EPROM, VPP is 12 V.

It is necessary that the first power supply voltage VDD is within a rated voltage range (for example, generally 5 V±10%) in a period of time when the memory LSI is in an operating condition. It is necessary that the second power supply voltage VPP is a high voltage (for example, generally 12 V±5%) at the time of programming or erasure and is within a range between the ground voltage and the first power supply voltage VDD at the time of reading or stand-by.

In such a case, a power supply voltage converting circuit incorporated in the memory LSI is required to have a function and a performance which will be explained hereinbelow.

Namely, when the second power supply voltage VPP is lower than the first power supply voltage VDD, as at the time of reading or stand-by, it is necessary that a current path (or leakage current) from the first power supply voltage VDD to the second power supply voltage VPP is prevented from being generated. If such a leakage current is generated, an unnecessary current is consumed.

Also, it is necessary that an output of the power supply voltage converting circuit is clamped by the first power supply voltage VDD when the second power supply voltage VPP is lower than the first power supply voltage VDD and assumes the second power supply voltage VPP when the second power supply voltage VPP is higher than the first power supply voltage VDD by a predetermined value or more. If the output of the power supply voltage converting circuit is the same as the second power supply voltage VPP when the second power supply voltage VPP is lower than the first power supply voltage VDD, a circuit connected to the output of the power supply voltage converting circuit becomes unable to normally operate at the time of reading or stand-by since the voltage is low.

Therefore, the power supply voltage converting circuit employs a system in which the switching to either the second power supply voltage VPP or the first power supply voltage VDD is made in accordance with the value of the second power supply voltage VPP or a control signal such as a program signal.

In the prior art, however, a voltage higher than the second power supply voltage VPP is required for operation of the above-mentioned switching, as will be explained hereinbelow.

FIG. 4 shows a circuit diagram of the conventional power supply voltage converting circuit. In the figure, reference symbol VC1 denotes a power supply voltage converting circuit. At terminals T21 to T25, the power supply voltage converting circuit VC1 is connected to an external circuit and other circuits of a memory LSI.

The terminal T21 is an input terminal supplied with the second power supply voltage VPP, and reference symbol N21 denotes a signal line of VPP. The terminal T22 is an input terminal supplied with the first power supply voltage VDD, and symbol N22 denotes a signal line of VDD. The terminal T23 is an input terminal supplied with a first control input voltage VCNT, and symbol N23 denotes a signal line of VCNT. The terminal T24 is an input terminal supplied with a second control input voltage VCNTB, and symbol N27 denotes a signal line of VCNTB. The terminal T25 is an output terminal for outputting an output voltage VINT of the power supply voltage converting circuit VC1, and symbol N26 denotes a signal line of VINT.

Transistors M21 to M24 are N-channel enhancement insulated gate field effect transistors (MOSFET's). Symbol G denotes a grounded terminal, and symbols N28 and N29 denote signal lines connected to the grounded terminal G. Symbol HVSW denotes a high voltage switching circuit, and symbol PUMP denotes a booster circuit.

Next, explanation will be made of the connection of the power supply voltage converting circuit VC1.

Connected to the high voltage switching circuit HVSW are the signal line N23 for input of the first control input voltage VCNT, the signal line N21 for input of the second power supply voltage VPP, the signal line N22 for input of the first power supply voltage VDD, the signal line N28 as a grounded signal line and the signal line N24 for output of an output voltage VX.

Connected to the booster circuit PUMP are connected the signal line N23 for input of the first control input voltage VCNT, the signal line N21 for input of the second power supply voltage VPP, the signal line N22 for input of the first power supply voltage VDD, the signal line N29 as a grounded signal line and the signal line N25 for output of an output voltage VPUMP.

The gate of the transistor M21 is connected to the signal line N24, the drain thereof is connected to the signal line N22, and the source thereof is connected to the signal line N26.

The gate of the transistor M22 is connected to the signal line N27, the drain thereof is connected to the signal line N22, and the source thereof is connected to the signal line N26.

The gate of the transistor M23 is connected to the signal line N25, the drain thereof is connected to the signal line N21, and the source thereof is connected to the signal line N26.

The gate of the transistor M24 is connected to the signal line N23, the drain thereof is connected to the signal line N21, and the source thereof is connected to the signal line N26.

In the power supply voltage converting circuit VC1, the threshold voltage Vtm of the transistors M21 to M24 is, for example, 0.8 V. The first power supply voltage VDD is a fixed voltage within a range of 0 V and 7 V, and the second power supply voltage VPP changes within a range between 0 V and 12 V.

The high voltage switching circuit HVSW outputs the second power supply voltage VPP when a low level is inputted to the signal line N23 as a control input, and outputs the ground voltage 0 V when a high level is inputted to the signal line or control input N23. The booster circuit PUMP outputs the ground voltage 0 V when a low level is inputted to the signal line or control input N23, and outputs a voltage higher than the second power supply voltage VPP (for example, VPP+3 V) when a high level is inputted to the signal line or control input N23.

Next, the operation of the power supply voltage converting circuit VC1 will be explained with reference to Table 1 and FIG. 4.

TABLE 1

| SIGNAL VOLTAGE/ TRANSISTOR | VDD = 0–7 V VPP = 0–12 V | | |
|---|---|---|---|
| | VPP = 0 V – VDD | VPP = VDD – 12 V | |
| VCNT | 0 V | 0 V | VDD |
| VCNTB | VDD | VDD | 0 V |
| VX | VPP | VPP | 0 V |
| VPUMP | 0 V | 0 V | VPP + 3 V |
| VINT | VDD – Vtm | VDD – Vtm ~ VDD | VPP |
| M21 | ON | ON | OFF |
| M22 | ON | ON | OFF |
| M23 | OFF | OFF | ON |
| M24 | OFF | OFF | ON |

Table 1 shows the values of voltages VCNT, VX, VPUMP, VINT and VCNTB of the signal lines N23 to N27 and the switched states of the transistors M21 to M24 corresponding to the value of the second power supply voltage VPP.

First, when the value of the second power supply voltage VPP is between 0 V and the first power supply voltage VDD, the first control input voltage VCNT is 0 V, the second control input voltage VCNTB is VDD and the signal line N23 is at low level. Therefore, the output voltage VX of the high voltage switching circuit HVSW takes the second power supply voltage VPP, and the output voltage VPUMP of the booster circuit PUMP takes 0 V.

Since the transistors M21 to M24 are of N-channel enhancement type, the transistors M21 and M22 assume their turned-on conditions, and the transistors M23 and M24 assume their turned-off conditions.

In this case, the output voltage VINT appearing on the signal line N26 takes VDD–Vtm since VDD>VPP.

Next, when the value of the second power supply voltage VPP is between the first power supply voltage VDD and 12 V, the first control input voltage VCNT is 0 V and the second control input voltage VCNTB is the first power supply voltage VDD, the output voltage VX of the high voltage switching circuit HVSW takes the second power supply voltage VPP and the output voltage VPUMP of the booster circuit PUMP takes 0 V.

The transistors M21 and M22 assume their turned-on conditions, and the transistors M23 and M24 assume their turned-off conditions.

In this case, the output voltage VINT appearing on the signal line N26 takes the first power supply voltage VDD if VPP>(VDD+Vtm).

Further, when the value of the second power supply voltage VPP is between the first power supply voltage VDD and 12 V, the first control input voltage VCNT is the first power supply voltage VDD and the second control input voltage VCNTB is 0 V, the output voltage VX of the high voltage switching circuit HVSW takes 0 V and the output voltage VPUMP of the booster circuit PUMP takes, for example, VPP+3 V due to boosting.

In this case, since the transistors M21 and M22 assume their turned-off conditions and the transistors M23 and M24 assume their turned-on conditions, the output voltage VINT appearing on the signal line N26 takes the second power supply voltage VPP under the condition that the threshold voltage Vtm of the transistor M23 with the substrate bias effect thereof taken into consideration is smaller than 3 V.

Though the conventional power supply voltage converting circuit VC1 has been explained in the foregoing, this conventional power supply voltage converting circuit VC1 involves the following inconveniences.

Namely, in order to bring the transistor M23 into a turned-on condition to supply the second power supply voltage VPP to the signal line N26 of the output voltage VINT in the case where the second power supply voltage VPP is higher than the first power supply voltage VDD, it is necessary to make the output voltage VPUMP supplied to the gate of the transistor M23 higher than the second power supply voltage VPP. Hence the booster circuit PUMP for generating such a higher output voltage VPUMP is needed.

Generally, when a high voltage is used in an integrated circuit, the withstanding voltage of a transistor or the withstanding voltage of isolation between transistors is high. Therefore, the rule of a pattern layout should be moderated as compared with a general transistor, or an excess masking step for ensuring the high withstanding voltage should be added.

As a result, the pattern layout area of the integrated circuit is increased or the increase in number of fabrication steps brings about an increase in fabrication cost. The increase in fabrication cost becomes significant as the voltage value becomes higher.

In the above-mentioned power supply voltage converting circuit VC1, too, such inconveniences are encountered since it is necessary to generate a voltage higher than the second power supply voltage VPP by the booster circuit PUMP.

Also, when the second power supply voltage VPP is lower than the first power supply voltage VDD, the highest possible voltage as the output voltage VINT by the power supply voltage converting circuit VC1 is VDD–Vtm. As a result, the output voltage VINT becomes smaller than VDD and hence there may be the case where a circuit supplied with the output voltage VINT becomes slow in operating speed or becomes inoperative.

Further, since the power supply voltage converting circuit VC1 is provided for conversion of the power supply voltage, it is preferable that the output impedance of the power supply voltage converting circuit VC1 when the output voltage VINT is outputted is made as small as possible.

However, when the second power supply voltage VPP is outputted as the output voltage VINT, the output impedance of the transistor M23 becomes considerably large. This is because an ON current of the transistor M23 is represented by a triode region of the transistor as shown by the following equation:

$$(\text{ON current of transistor } M23) = \beta \times (V_{gs} - V_{tm})V_{ds} - V_{ds}^2/2 \quad (1)$$

where $\beta$ is a constant determined by the mobility of the transistor, the thickness of a gate oxide film, and the gate length and gate width of the transistor, Vgs a difference in potential between the gate and the source of the transistor M23, and Vds, a difference in potential between the drain and the source of the transistor M23.

In the power supply voltage converting circuit VC1, the potential difference between the gate and the source is small, for example, 3 V and the threshold voltage Vtm comes to, for example, 2 V due to the substrate bias effect. Therefore, it is obvious from equation (1) that the value of Vgs−Vtm, and hence the ON current cannot be made large.

As another prior art, JP-A-5-101686 has disclosed a microcomputer having an EPROM incorporated therein and more particularly a circuit in such a microcomputer with which a leakage current from a VDD terminal supplied with a microcomputer driving voltage is prevented from flowing toward a VPP terminal supplied with a data writing voltage.

In this circuit, the leakage current from the VDD terminal to the VPP terminal can be prevented if the value of the writing voltage VPP is not larger than the driving voltage VDD subtracted by a value corresponding to the threshold voltage of a P-channel MOS transistor (for example, VPP is equal to or smaller than 4.2 V when VDD is 5 V and the absolute value of the threshold voltage of the P-channel MOS transistor is 0.8 V).

However, when the value of the writing voltage VPP is, for example, a voltage between 4.2 V and 5 V, the transistor for preventing the leakage current is not brought into a turned-on condition, and it is therefore difficult to completely arrest the leakage current from the VDD terminal to the VPP terminal.

Further, when the writing voltage VPP is higher than the driving voltage VDD and a control signal PGM takes a low level, the gate of a transistor connected between the VPP terminal and an output signal line is inputted with a voltage corresponding to the subtraction of the forward voltage of a diode from the writing voltage VPP. Therefore, the transistor is not brought into a completely turned-off condition and hence a leakage current may flow from the VPP terminal to the VDD terminal.

SUMMARY OF THE INVENTION

The present invention is directed to a voltage selecting device for receiving a first power supply voltage VDD and a second power supply voltage VPP, and selectively outputting one of the first and second power supply voltages in accordance with a control signal. Such a voltage selecting device outputs the first or second power supply voltage without requiring a voltage higher than VPP and with a relatively low impedance and is free of the generation of a leakage current between the first power supply voltage VDD and the second power supply voltage VPP.

A voltage selecting device of the present invention comprises a first input signal terminal for receiving a first voltage signal, a second input signal terminal for receiving a second voltage signal, a control signal input terminal for receiving a control signal, an output terminal for selectively outputting one of the first and second voltage signals, a first switching circuit connected between the first input terminal and the output terminal and including at least one transistor, a second switching circuit connected between the second input terminal and the output terminal and including at least two series-connected transistors, and control means. The control means provide for bringing the first switching transistor into a turned-off condition and the second switching transistor into a turned-on condition when the control signal exists at the control signal terminal under a first voltage condition that the voltage value of the second voltage signal is higher than the voltage value of the first voltage signal by at least a predetermined value, and bringing the first switching transistor into a turned-on condition and the second switching transistor into a turned-off condition when the control signal does not exist at the control signal terminal under the first voltage condition and when a second voltage condition other than the first voltage condition is satisfied.

In one embodiment of the present invention, each of the two transistors included in the second switching means is a P-channel MOSFET.

In another embodiment of the present invention, there is provided detecting means for detecting whether or not the second voltage signal has a voltage higher than the first voltage signal by at least the predetermined value, and the control means makes an ON/OFF control of the second switching means on the basis of an output of the detecting means.

In the present invention, the second switching means including at least two series-connected transistors is provided. Therefore, even when the second voltage is lower than the first voltage, no leakage current flows between the first and second voltages since the second switching means can be brought into a completely turned-off condition.

Also, when the transistor included in the second switching means is the P-channel MOSFET, an input voltage can be outputted without performing the boosting of voltage and with a relatively low impedance.

DESCRIPTION OF THE PREFERRED EMBODIMENTS

Now, embodiments of the present invention will be explained with reference to FIGS. 1 to 3.

Figure 1:
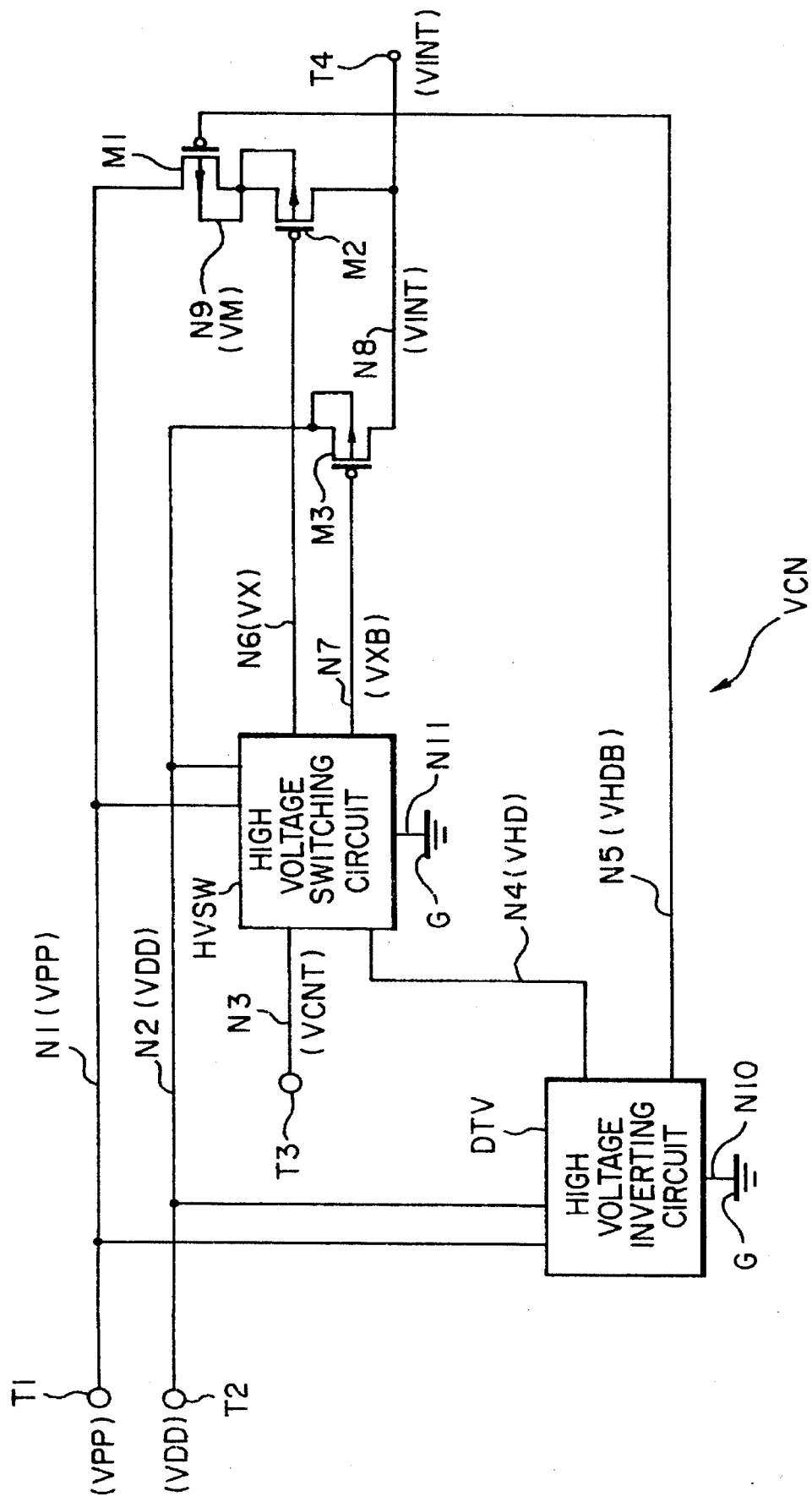
FIG. 1 is a diagram showing the circuit construction of a voltage selecting device according to one embodiment of the present invention.

FIG. 1 is a diagram showing the circuit construction of a voltage selecting device according to one embodiment of the present invention.

In FIG. 1, reference symbol VCN denotes a power supply voltage converting circuit of the present embodiment. At terminals T1 to T4, the power supply voltage converting circuit VCN is connected to an external circuit and other circuits of a memory LSI.

The terminal T1 is an input terminal for receiving a second power supply voltage VPP which is variable within a predetermined voltage range, for example, between 0 V and 12 V, and reference symbol N1 denotes a signal line of VPP. The terminal T2 is an input terminal for receiving a first power supply voltage VDD which is a constant voltage within a predetermined voltage range, for example, between 0 V and 7 V, and symbol N2 denotes a signal line of VDD. The terminal T3 is an input terminal supplied with a control input voltage VCNT of the power supply voltage converting circuit VCN of the present embodiment, and symbol N3 denotes a signal line of VCNT. The terminal T4 is an output terminal for outputting an output voltage VINT of the power supply voltage converting circuit VCN, and symbol N8 denotes a signal line of VINT.

Transistors M1 to M3 are P-channel enhancement insulated gate field effect transistors (MOSFET's). Symbol G denotes a grounded terminal, and symbols N10 and N11 denote signal lines connected to the grounded terminal G. Symbol HVSW denotes a high voltage switching circuit, and symbol DTV denotes a high voltage inverting circuit.

Next, explanation will be made of the connection of the power supply voltage converting circuit VCN of the present embodiment.

Connected to the high voltage switching circuit HVSW are the signal line N3 for input of the first control input voltage VCNT, the signal line N1 for input of the second power supply voltage VPP, the signal line N2 for input of the first power supply voltage VDD, the signal line N11 as a grounded signal line, a signal line N6 for output of an output signal VX and a signal line N7 for output of an output voltage VXB which has a logically inverted relation with the output voltage VX.

Connected to the high voltage inverting circuit DTV are the signal line N1 for input of the second power supply voltage VPP, the signal line N2 for input of the first power supply voltage VDD, the signal line N10 as a grounded signal line, a signal line N4 for output of an output signal VHD and a signal line N5 for output of an output voltage VHDB which has a logically inverted relation with the output voltage VHD.

The gate of the transistor M1 is connected to the signal line N5 of the output voltage VHDB, the source thereof is connected to the signal line N1 of the second power supply voltage VPP, and the drain and the substrate thereof are connected to a signal line N9 of a voltage VM.

The gate of the transistor M3 is connected to the signal line N7 of the output voltage VXB, the drain and the substrate thereof are connected to the signal line N2 of the first power supply voltage VDD, and the source thereof is connected to the signal line N8 of the output voltage VINT.

The gate of the transistor M2 is connected to the signal line N6 of the output voltage VX, the drain and the substrate thereof are connected to the signal line N9 of the voltage VM, and the source thereof is connected to the signal line N8 of the output voltage VINT.

In the power supply voltage converting circuit VCN, the threshold voltage Vtm of the transistors M1 to M3 is, for example, $-0.8$ V, the first power supply voltage VDD is variable within a range of 0 V and 7 V, and the second power supply voltage VPP is variable within a range of 0 V and 12 V.

Figure 3:
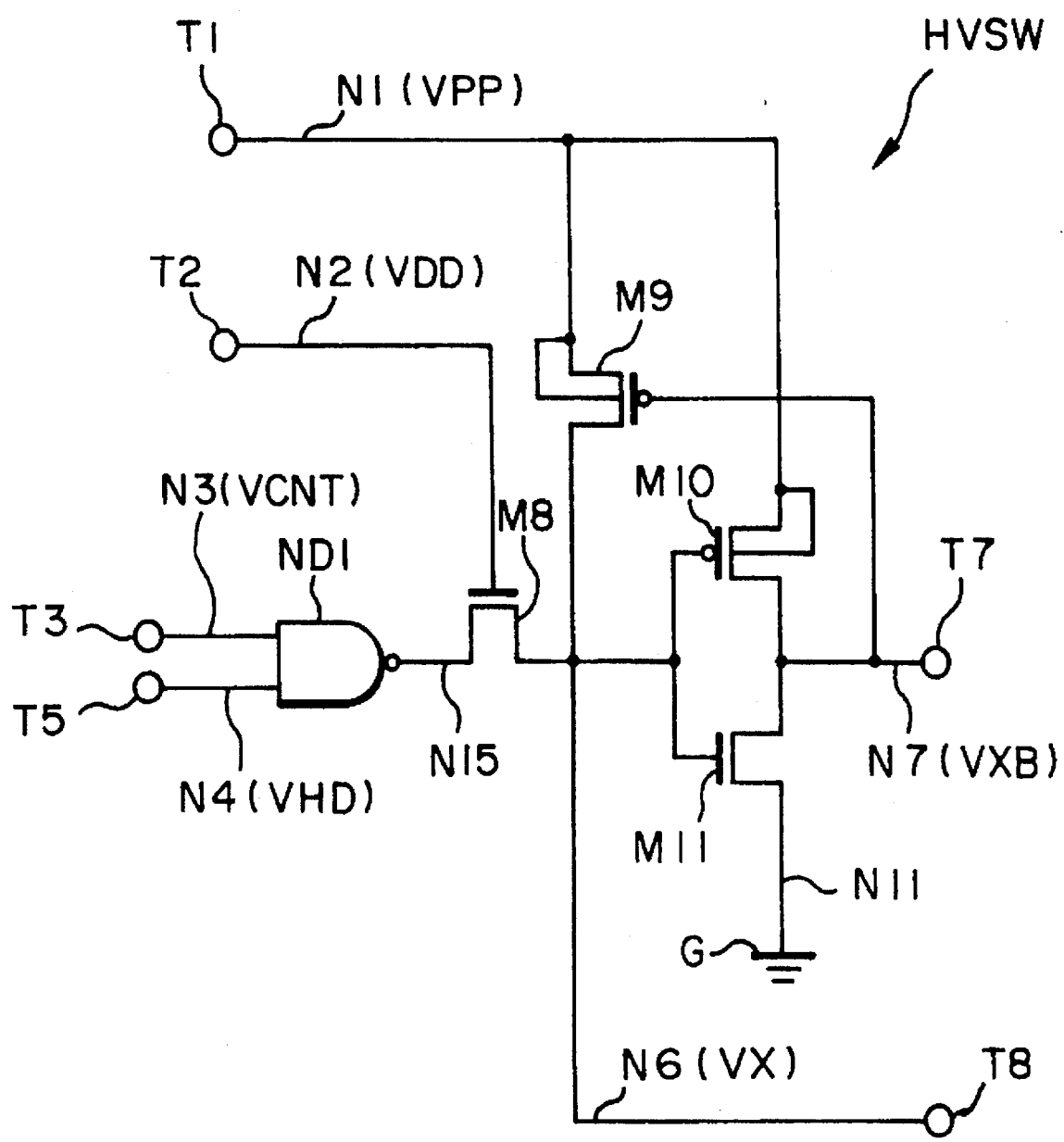
FIG. 3 is a circuit diagram showing the construction of a high voltage switching circuit used in the voltage selecting device shown in FIG. 1.

The high voltage switching circuit HVSW has a circuit construction as shown in FIG. 3. When a low level is inputted as a control input from the signal line N3, the high voltage switching circuit HVSW outputs the second power supply voltage VPP to the signal line N6 and the ground voltage 0 V to the signal line N7. When a high level is inputted as the control input from the signal line N3, the high voltage switching circuit HVSW outputs the ground voltage 0 V to the signal line N6 and the second power supply voltage VPP to the signal line N7.

Figure 2:
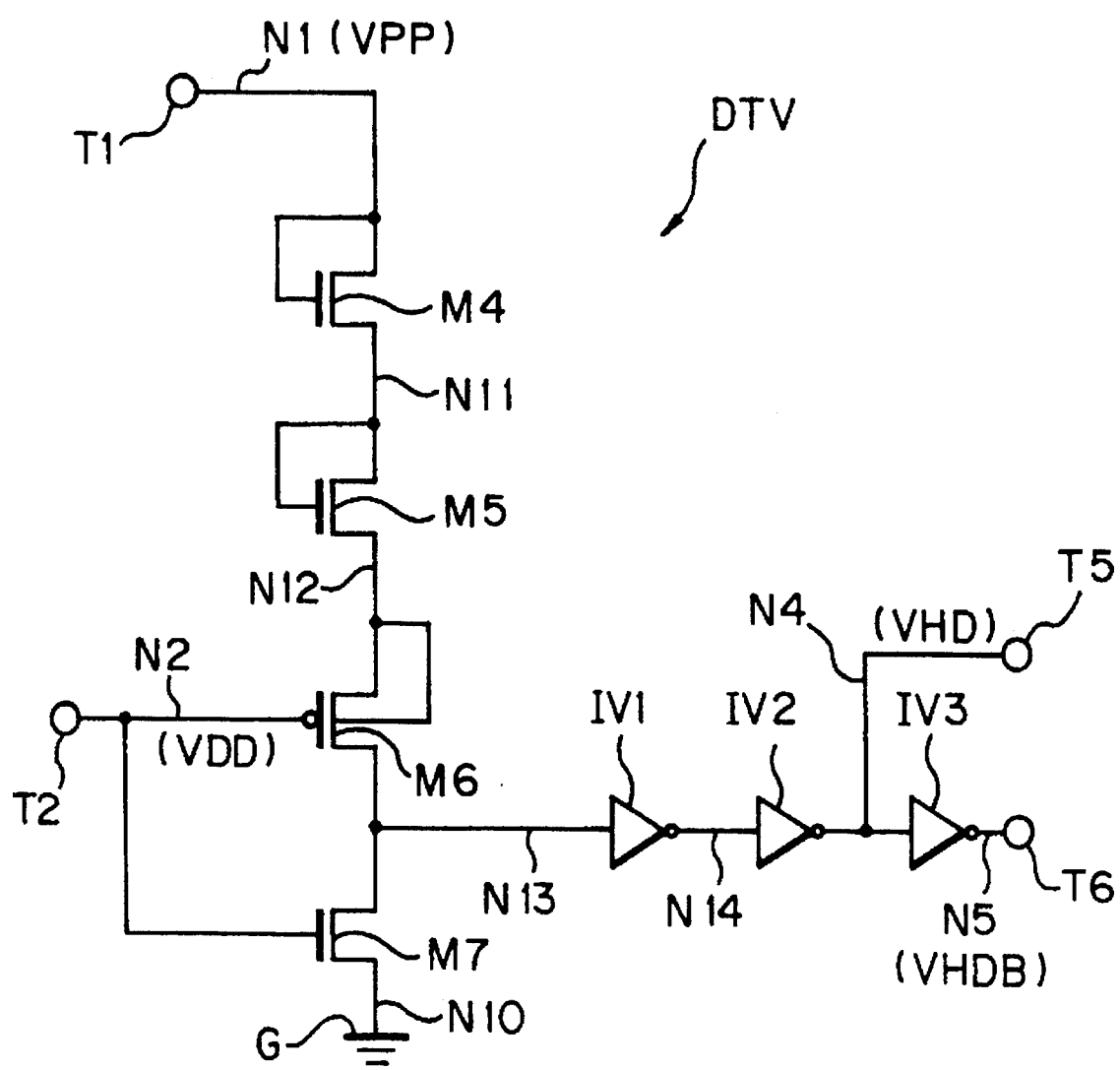
FIG. 2 is a circuit diagram showing the construction of a high voltage inverting circuit used in the voltage selecting device shown in FIG. 1.

The high voltage inverting circuit DTV has a circuit construction as shown in FIG. 2. When the second power supply voltage VPP is higher than the first power supply voltage VDD by at least a predetermined value (for example, 4 V), the high voltage inverting circuit DTV outputs the ground voltage 0 V to the signal line N5 and the first power supply voltage VDD to the signal line N4. In the other case, the high voltage inverting circuit DTV outputs the first power supply voltage VDD to the signal line N5 and the ground voltage 0 V to the signal line N4.

Next, the operation of the power supply voltage converting circuit VCN will be explained with reference to Table 2 and FIG. 1.

TABLE 2

| SIGNAL VOLTAGE/ TRANSISTOR | VDD = 0–7 V VPP = 0–12 V | | |
|---|---|---|---|
| | VPP = 0 V – VDD | VPP = VDD – 9 V | VPP = 9 V–12 V |
| VCNT | 0 V | 0 V | 0 V VDD |
| VHD | 0 V | 0 V | VDD VDD |
| VHDB | VDD | VDD | 0 V 0 V |
| VX | VPP | VPP | VPP 0 V |
| VXB | 0 V | 0 V | 0 V VPP |
| VM | VDD – 0.7 – VDD | VDD – 0.7 V | VPP VPP |
| VINT | VDD | VDD | VDD VPP |
| M1 | OFF | OFF | ON ON |
| M2 | ON | OFF | OFF ON |
| M3 | ON | ON | ON OFF |

Table 2 shows the values of voltages VCNT, VHD, VHDB, VX, VXB, VINT and VM of the signal lines N3 to N9 and the switched states of the transistors M1 to M3 corresponding to the value of the second power supply voltage VPP and the logical level of the control input.

First, when the value of the second power supply voltage VPP is between 0 V and the first power supply voltage VDD and the control input voltage VCNT is 0 V, the signal line N3 takes a low level. The output voltage VX of the high voltage switching circuit HVSW on the signal line N6 takes the second power supply voltage VPP and the output voltage VXB on the signal line N7 is 0 V. Also, the output voltage VHD of the high voltage inverting circuit DTV on the signal line N4 takes 0 V and the output voltage VHDB thereof on the signal line N5 takes the first power supply voltage VDD.

Since the transistors M1 to M3 are P-channel enhancement type, the transistor M3 assumes a turned-on condition so that the output voltage VINT on the signal line N8 takes the first power supply voltage VDD.

When a relationship in value between the first and second power supply voltages is VPP<VDD+Vtm, the transistor M2 assumes a turned-on condition since the gate voltage of the transistor M2 takes the second power supply voltage VPP, and the source voltage thereof takes the first power supply voltage VDD. Accordingly, the voltage VM on the signal line N9 takes the first power supply voltage VDD.

On the other hand, the transistor M1 assumes a turned-off condition since the drain voltage of the transistor M1 takes the second power supply voltage VPP and the gate, source and substrate voltages thereof take the first power supply voltage VDD. As a result, no leakage current is generated from the signal line N8 of the output voltage VINT to the signal line N1 of the second power supply voltage VPP.

When the relationship in value between the first and second power supply voltages is VDD>VPP>VDD+Vtm, the channel of the transistor M2 does not assume a turned-on condition since a difference in potential between the gate and source of the transistor M2 is smaller than at least |Vtm|.

However, since the signal line N9 is connected to the substrate of the transistor M2, a PN junction between the source and substrate of the transistor M2 is biased in a forward direction so that the signal line N9 of the voltage VM takes a voltage corresponding to the subtraction of a forward voltage of the PN junction (for example, 0.7 V) from the first power supply voltage VDD (for example, VDD–0.7 V).

On the other hand, the transistor M1 assumes a turned-off condition since the drain voltage of the transistor M1 takes the second power supply voltage VPP. The gate voltage thereof takes the first power supply voltage VDD and the source and substrate voltages thereof take a voltage between VDD–0.7 V and the first power supply voltage VDD. As a result, no leakage current is generated from the signal line N8 of the output voltage VINT to the signal line N1 of the second power supply voltage VPP.

Next, when the value of the second power supply voltage VPP is between the first power source voltage VDD and 9 V and the control input voltage VCNT is 0 V, the signal line N3 takes a low level so that the output voltage VX of the high voltage switching circuit HVSW on the signal line N6 takes the second power supply voltage VPP and the output voltage VXB thereof on the signal line N7 takes 0 V. Also, the output voltage VHD of the high voltage inverting circuit DTV on the signal line N4 takes 0 V, and the output voltage VHDB on the signal line N5 takes the first power supply voltage VDD.

Since the operating conditions of the transistors M1 to M3 in this case are the same as those in the above-mentioned case where the relationship in value between the first and second power supply voltages is VDD>VPP>VDD+Vtm, the transistors M1 and M2 assume their turned-off conditions and the transistor M3 assumes its turned-on condition. Accordingly, the output voltage VINT takes the first power supply voltage VDD.

Further, when the value of the second power supply voltage VPP is between 9 V and 12 V and the control input voltage VCNT is 0 V, the signal line N3 takes a low level so that the output voltage VX of the high voltage switching circuit HVSW on the signal line N6 takes the second power supply voltage VPP and the output voltage VXB thereof on the signal line N7 takes 0 V. Also, the output voltage VHD of the high voltage inverting circuit DTV on the signal line N4 takes the first power supply voltage VDD and the output voltage VHDB on the signal line N5 is 0 V.

In this case, the transistor M3 assumes a turned-on condition. The transistor M1 also assumes a turned-on condition since the drain voltage of the transistor M1 takes the second power supply voltage VPP and the gate voltage thereof takes 0 V. Therefore, the voltage VM of the source and the substrate of the transistor M1 is changed to the second power supply voltage VPP. The transistor M2 remains in the turned-off condition since the gate voltage of the transistor M2 takes the second power supply voltage VPP, the voltage VM of the drain and the substrate thereof takes the second power supply voltage VPP and the source voltage thereof takes the first power supply voltage VDD. Accordingly, the output voltage VINT remains at the first power supply voltage VDD.

Also, when the value of the second power supply voltage VPP is between 9 V and 12 V and the control input voltage VCNT is the first power supply voltage VDD, the signal line N3 takes a high level so that the output voltage VX of the high voltage switching circuit HVSW on the signal line N6 takes 0 V and the output voltage VXB thereof on the signal line N7 takes the second power supply voltage VPP. Also, the output voltage VHD of the high voltage inverting circuit DTV on the signal line N4 takes the first power supply voltage VDD and the output voltage VHDB on the signal line N5 takes 0 V.

In this case, the transistor M3 is changed to a turned-off condition since the gate voltage of the transistor M3 takes the second power supply voltage VPP and the source and substrate voltages thereof take the first power supply voltage VDD. The transistor M1 assumes a turned-on condition since the gate voltage of the transistor M1 takes 0 V and the drain voltage thereof takes the second power supply voltage VPP. Therefore, the voltage VM of the source and the substrate of the transistor M1 is changed to the second power supply voltage VPP. The transistor M2 is changed to a turned-on condition since the gate voltage of the transistor M2 takes 0 V and the voltage VM of the drain and the substrate thereof takes the second power supply voltage VPP. Therefore, the source voltage of the transistor M2 takes the second power supply voltage VPP. Accordingly, the output voltage VINT is changed to the second power supply voltage VPP.

Next, the high voltage inverting circuit DTV shown in FIG. 1 will be explained with reference to FIG. 2.

In FIG. 2, reference symbol T1 denotes an input terminal supplied with the second power supply voltage VPP, and symbol N1 denotes a signal line of VPP. Symbol T2 denotes an input terminal supplied with the first power supply voltage VDD, and symbol N2 denotes a signal line of VDD. Symbol T5 denotes a first output terminal for outputting an output voltage VHD of the high voltage inverting circuit DTV, and symbol N4 denotes a signal line of VHD. Symbol T6 denotes a second output terminal for outputting an output voltage VHDB of the high voltage inverting circuit DTV, and symbol N5 denotes a signal line of VHDB. Symbol G denotes a grounded terminal, and symbol N10 denotes a signal line for the grounded terminal G.

Transistors M4, M5 and M7 are N-channel enhancement MOSFET's, and a transistor M6 is a P-channel enhancement MOSFET. Symbols IV1 to IV3 denote logical inverters. Though not shown in FIG. 2, the first power supply voltage VDD and the ground voltage are supplied to a power supply line and a grounded line of each of the logical inverters IV1 to IV3.

Explanation will now be made of the connection of the high voltage inverting circuit DTV in the present embodiment.

The drain and the gate of the transistor M4 are connected to the signal line N1 of the second power supply voltage VPP, and the source thereof is connected to a signal line N11.

The drain and the gate of the transistor M5 are connected to the signal line N11, and the source thereof is connected to a signal line N12.

The source and the substrate of the transistor M6 are connected to the signal line N12, the gate thereof is connected to the signal line N2 of the first power supply voltage VDD, and the drain thereof is connected to a signal line N13.

The drain of the transistor M7 is connected to the signal line N13, the gate thereof is connected to the signal line N2 of the first power supply voltage VDD, and the source thereof is connected to the signal line N10.

Though not shown in FIG. 2, a grounded terminal is connected to the substrates of the transistor M4, M5 and M7.

An input of the inverter IV1 is connected to the signal line N13, and an output thereof is connected to a signal line N14.

An input of the inverter IV2 is connected to the signal line N14, and an output thereof is connected to the signal line N4 for outputting the output voltage VHD of the high voltage inverting circuit DTV.

An input of the inverter IV3 is connected to the signal line N4 for outputting the output voltage VHD of the high voltage inverting circuit DTV, and an output thereof is connected to the signal line N5 for outputted the output voltage VHDB of the high voltage inverting circuit DTV.

The operation of the high voltage inverting circuit DTV will now be explained.

First, when the second power supply voltage VPP is lower than the first power supply voltage VDD, the transistor M7 assumes a turned-on condition since the gate voltage of the transistor M7 is the first power supply voltage VDD (for example, 5 V) and the source voltage thereof is the ground voltage (for example, 0 V). The transistor M6 assumes a turned-off condition since the gate voltage of the transistor M6 is the first power supply voltage VDD and the source and substrate voltages thereof take a voltage which is not higher than the first power supply voltage VDD.

Accordingly, the voltage of the signal line N13 takes the ground voltage and the voltage of the signal line N14 takes the first power supply voltage VDD, so that the output voltage VHD of the high voltage inverting circuit DTV takes the ground voltage, and the output voltage VHDB of the high voltage inverting circuit DTV takes the first power supply voltage VDD.

When the second power supply voltage VPP becomes higher than the first power supply voltage VDD (for example, VDD+3 V) so that the voltage of the signal line N12 takes a value higher than the first power supply voltage VDD by the threshold voltage of the transistor M6 (for example, 0.8 V), the transistor M6 assumes a turned-on condition. In this case, since the transistor M7 is also in a turned-on condition, the voltage of the signal line N13 is determined by the ratio of the ON resistances of the transistors M6 and M7 to each other.

When the second power supply voltage VPP is further increased as compared with the first power supply voltage VDD (for example, VDD+4 V) so that the ON resistance of the transistor M6 becomes sufficiently small as compared with that of the transistor M7, the voltage of the signal line N13 gets near the first power supply voltage VDD. Provided that the threshold value of the inverter IV1 is at a level between the ground voltage and the first power supply voltage VDD, the voltage of the signal line N14 takes the ground voltage so that the output voltage VHD of the high voltage inverting circuit DTV takes the first power supply voltage VDD, and the output voltage VHDB of the high voltage inverting circuit DTV takes the ground voltage.

When the transistor M6 is in a turned-off condition, the voltage of the signal line N12 takes a value corresponding to the subtraction of the threshold voltages of the transistors M1 and M2 from the second power supply voltage VPP.

As explained above, the output voltages VHD and VHDB of the high voltage inverting circuit DTV in the present embodiment are inverted when the second power supply voltage VPP becomes higher than the first power supply voltage VDD by a predetermined value.

Next, the high voltage switching circuit HVSW shown in FIG. 1 will be explained with referring to FIG. 3.

In FIG. 3, reference symbol T1 denotes an input terminal supplied with the second power supply voltage VPP, and symbol N1 denotes a signal line of VPP. Symbol T2 denotes an input terminal supplied with the first power supply voltage VDD, and symbol N2 denotes a signal line of VDD. Symbol T3 denotes an input terminal inputted with the control input voltage VCNT, and symbol N3 denotes a signal line of VCNT. Symbol T5 denotes an input terminal inputted with the output voltage VHD of the high voltage inverting circuit DTV, and symbol N4 denotes a signal line of VHD. Symbol T8 denotes a first output terminal for outputting an output voltage VX of the high voltage switching circuit HVSW, and symbol N16 denotes a signal line of VX. Symbol T7 denotes a second output terminal for outputting an output voltage VXB of the high voltage switching circuit HVSW, and symbol N17 denotes a signal line of VXB. Symbol G denotes a grounded terminal, and symbol N11 denotes a signal line for the grounded terminal G.

Transistors M8 and M11 are N-channel enhancement MOSFET's, and transistors M9 and M10 are P-channel enhancement MOSFET's. Symbol ND1 denotes a two-input NAND gate (or the inverted version of a logical product gate). Though not shown in FIG. 3, the first power supply voltage VDD and the ground voltage are supplied to a power supply line and a grounded line of the two-input NAND gate ND1.

Explanation will now be made of the connection of the high voltage switching circuit HVSW in the present embodiment.

One input of the two-input NAND gate ND1 is connected to the signal line N3 of the control input voltage VCNT, the other input thereof is connected to the signal line of the output voltage VHD of the high voltage inverting circuit DTV, and an output thereof is connected to a signal line N15.

The drain of the transistor M8 is connected to the signal line N15, the gate thereof is connected to the signal line N2 of the first power supply voltage VDD, and the source thereof is connected to the signal line N16 of the output voltage VX of the high voltage switching circuit HVSW.

The source and the substrate of the transistor M9 are connected to the signal line N1 of the second power supply voltage VPP, the gate thereof is connected to the signal line N17 of the output voltage VXB of the high voltage switching circuit HVSW, and the drain thereof is connected to the signal line N16 of the output voltage VX of the high voltage switching circuit HVSW.

The source and the substrate of the transistor M10 are connected to the signal line N1 of the second power supply voltage VPP, the gate thereof is connected to the signal line N16 of the output voltage VX of the high voltage switching circuit HVSW, and the drain thereof is connected to the signal line N17 of the output voltage VXB of the high voltage switching circuit HVSW.

The gate of the transistor M11 is connected to the signal line N16 of the output voltage VX of the high voltage switching circuit HVSW, the drain thereof is connected to the signal line N17 of the output voltage VXB of the high voltage switching circuit HVSW, and the source thereof is connected to the grounded line N11.

The operation of the high voltage switching circuit HVSW will now be explained.

First, when the first power supply voltage VDD is inputted to both the input terminal T3 of the control input voltage VCNT and the input terminal T5 of the output voltage VHD of the high voltage inverting circuit DTV, the voltage of the signal line N15 takes the ground voltage (for example, 0 V). The transistor M8 assumes a turned-on condition since the gate voltage of the transistor M8 is at the first power supply voltage VDD. By making the output impedance of the two-input NAND gate ND1 and the ON resistance of the transistor M8 sufficiently small as compared with the ON resistance of the transistor M9, the output voltage VX of the high voltage switching circuit HVSW on the signal line N16 takes the ground voltage.

At this time, the transistor M11 assumes a turned-off condition and the transistor M10 assumes a turned-on condition, so that the output voltage VXB of the high voltage switching circuit HVSW on the signal line N17 takes the second power supply voltage VPP. The transistor M9 assumes a turned-off condition when the gate voltage of the transistor M9 becomes the second power supply voltage VPP.

When the ground voltage is inputted to the input terminal T3 of the control input voltage VCNT or the input terminal T5 of the output voltage VHD of the high voltage inverting circuit DTV, the voltage of the signal line N15 takes the first power supply voltage VDD. Since the gate voltage of the transistor M8 is also the first power supply voltage VDD, the output voltage VX of the high voltage switching circuit HVSW on the signal line N16 takes at least a value corresponding to the subtraction of the threshold voltage of the transistor M8 (for example, 0.8 V) from the first power supply voltage VDD.

By making the ON resistance of the transistor M11 sufficiently small as compared with that of the transistor M10, the output voltage VXB of the high voltage switching circuit HVSW on the signal line N17 takes the ground voltage.

At this time, the transistor M9 assumes a turned-on condition so that the output voltage VX of the high voltage switching circuit HVSW on the signal line N16 is increased to the second power supply voltage VPP.

As explained above, in the power supply voltage converting circuit VCN in the present embodiment, a leakage current can be prevented from flowing from the first power supply voltage VDD to the second power supply voltage VPP even when the second power supply voltage VPP is lower than the first power supply voltage VDD.

Also, when the second power supply voltage VPP is lower than the first power supply voltage VDD, the output voltage VINT when the first power supply voltage VDD is outputted can be prevented from becoming lower than the first power supply voltage VDD.

Further, when the second power supply voltage VPP is outputted as the output voltage VINT, a booster circuit is not required as used in the conventional power supply voltage converting circuit. As a result, the simplification of the fabrication step and the reduction of a pattern layout area become possible.

Also, the output impedance when the second power supply voltage VPP is outputted as the output voltage VINT can be made low as compared with the conventional power supply voltage converting circuit. Namely, the ON current of the transistor M1 or M2 determining the output impedance is represented by the following equation (2) of the saturation region of the transistor:

$$\text{(ON current of transistor } M, M2) = 0.5 \ \beta (V_{gs} - V_{tm})^2. \quad (2)$$

The voltage Vgs between the gate and the source of the transistor M1 or M2 when the second power supply voltage VPP is outputted can be made large since the source voltage of the transistor M1 or M2 is the second power supply voltage VPP and the gate voltage thereof is 0 V. Accordingly, it is obvious from equation (2) that even if the effective mobility of the P-channel transistor M1 or M2 is small or about ½ of an N-channel transistor is taken into consideration, it is possible to obtain the ON current which is large as compared with that in the conventional power supply voltage converting circuit.

Also, according to the voltage converting circuit of the present embodiment, the output voltage VINT can be switched to either the second power supply voltage VPP or the first power supply voltage VDD in accordance with the control input signal even when the second power supply voltage VPP is higher than the first power supply voltage VDD.

Figure 4:
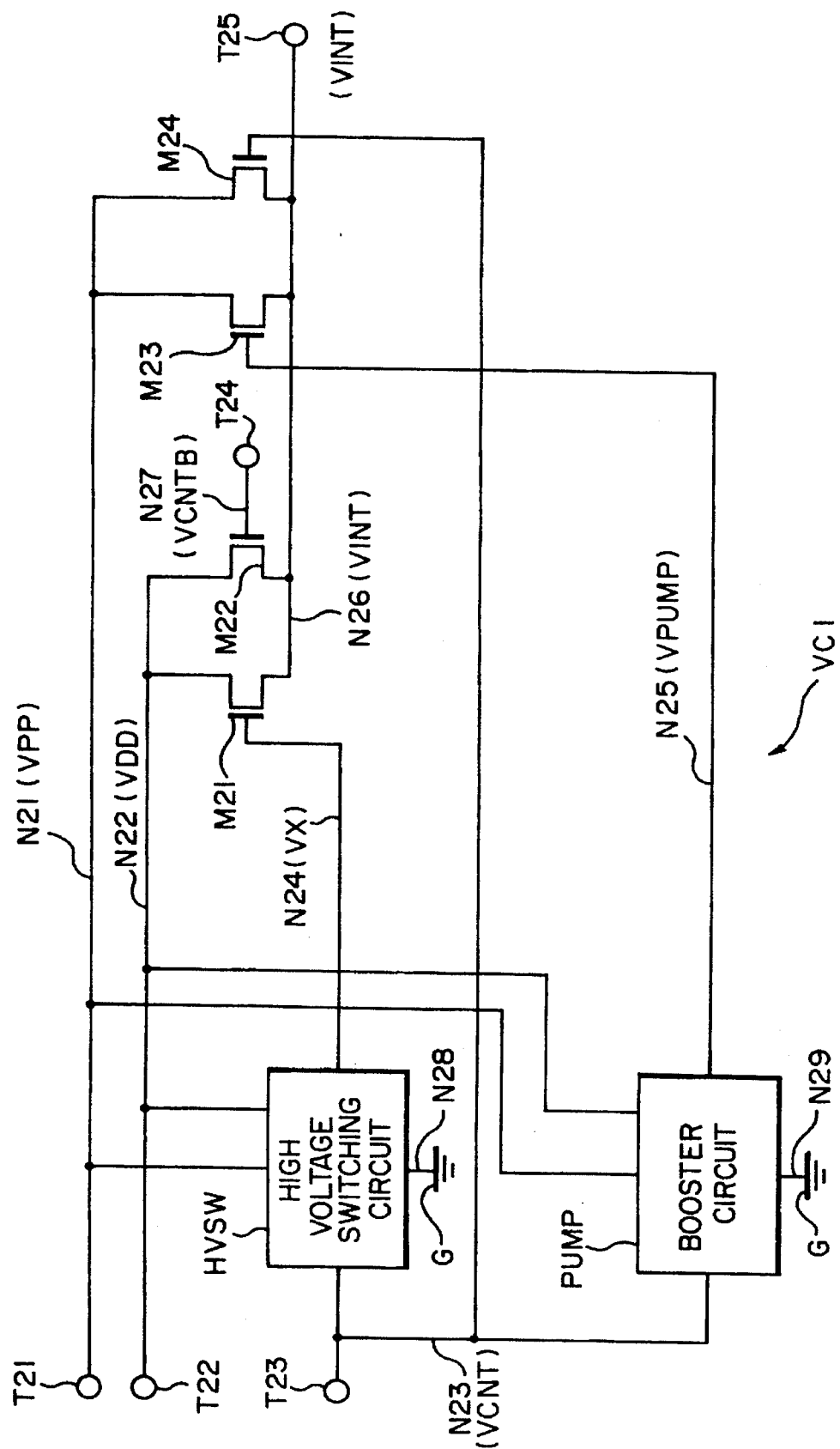
FIG. 4 is a diagram showing the circuit construction of the conventional voltage selecting device.

In the foregoing, the present invention has been explained in conjunction with one embodiment. However, the present invention is not limited to the above-mentioned embodiment. Various effective modifications or changes of the above embodiment are possible on the basis of the technical concept of the present invention. For example, though the transistor M3 in the voltage converting circuit of the embodiment shown in FIG. 1 is a P-channel MOS transistor, the transistor M3 may be an N-channel MOS transistor. In this case, however, the output voltage VINT, when the second power supply voltage VPP is lower than the first power supply voltage VDD, should be decreased to a value not larger than the first power supply voltage VDD, as in the conventional power supply voltage converting circuit shown in FIG. 4.

Also, a transistor for control may be provided between the signal line N8 of the output voltage VINT and the signal line N2 of the first power supply voltage VDD or the signal line N1 of the second power supply voltage VPP.

Further, the high voltage switching circuit HVSW and the high voltage inverting circuit DTV in the above embodiment are one means for switching the transistors M1 to M3. Another means can be used.

According to the present invention, the provision of at least two series-connected transistors in the second switching means prevents the generation of a leakage current between the first voltage and the second voltage since the second switching means can be brought into a completely turned-off condition even when the second voltage is lower than the first voltage.

I claim:

1. A power supply circuit for providing a selective voltage to memory devices, comprising:

a first input terminal for receiving a first voltage signal ranging from zero to a first value;

a second input terminal for receiving a second voltage signal which has three ranges, wherein a first range is from zero to said first value, a second range is from said first value to a second value, and a third range is from said second value to a third value;

a control signal input terminal for receiving a control signal;

an output terminal for selectively providing either said first or second voltage signal;

a first switching circuit which includes a first MOS transistor connected between said first input terminal and said output terminal;

a second switching circuit which includes a second and a third MOS transistor having a common substrate and being connected in series, said second MOS transistor having a source connected to said second input terminal, said third MOS transistor having a source connected to said output terminal, said second and third MOS transistors having drains connected to each other and held at a potential of said common substrate; and control means for controlling said first and second switching circuits, wherein said first MOS transistor is nonconductive and said second and third MOS transistors are conductive if said control signal is substantially the same as said first voltage signal and said second voltage signal is in said third range thereby providing said second voltage signal from said output terminal, and said first MOS transistor is conductive and at least one of said second and third MOS transistors is nonconductive if said control signal is other than said first voltage signal thereby providing said first voltage signal from said output terminal.

2. The power supply circuit according to claim 1, wherein said control means comprise:

first control means for controlling said first switching circuit to make said first MOS transistor nonconductive only when said second voltage signal is in said third range and said control signal is substantially the same as said first voltage signal; and second control means for controlling said second switching circuit to make said second MOS transistor conductive when said second voltage signal is in said third range and to make said third MOS transistor conductive when either said second voltage signal is in said first range or said second voltage signal is in said third range and said control signal is substantially the same as said first voltage signal.

3. The power supply circuit according to claim 1, said control means further comprises voltage detecting means for monitoring said second voltage signal to detect said second voltage signal being in one of said three ranges.

* * * * *